United States Patent
Bi et al.

(10) Patent No.: US 11,075,200 B2
(45) Date of Patent: Jul. 27, 2021

(54) INTEGRATED DEVICE WITH VERTICAL FIELD-EFFECT TRANSISTORS AND HYBRID CHANNELS

(71) Applicant: International Business Machines Corporation, Armonk, NY (US)

(72) Inventors: Zhenxing Bi, Dunn Loring, VA (US); Kangguo Cheng, Schenectady, NY (US); Zheng Xu, Wappingers Falls, NY (US); Dexin Kong, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 16/691,732

(22) Filed: Nov. 22, 2019

(65) Prior Publication Data
US 2020/0161303 A1 May 21, 2020

Related U.S. Application Data

(62) Division of application No. 16/192,896, filed on Nov. 16, 2018, now Pat. No. 10,679,992.

(51) Int. Cl.
*H01L 27/092* (2006.01)
*H01L 29/20* (2006.01)
(Continued)

(52) U.S. Cl.
CPC ...... *H01L 27/0922* (2013.01); *H01L 21/0337* (2013.01); *H01L 21/823807* (2013.01);
(Continued)

(58) Field of Classification Search
CPC .......... H01L 27/0922; H01L 29/66666; H01L 29/0847; H01L 21/823885; H01L 21/0337;
(Continued)

(56) References Cited

U.S. PATENT DOCUMENTS

| 7,199,451 B2 | 4/2007 | Kelman |
| 7,700,420 B2 | 4/2010 | Thean et al. |

(Continued)

OTHER PUBLICATIONS

A Dadgar et al., "Epitaxy of GaN on silicon—impact of symmetry and surface reconstruction", New J. Phys. 9. 389, (2007): 10 pages.
(Continued)

*Primary Examiner* — Patricia D Reddington
(74) *Attorney, Agent, or Firm* — Cantor Colburn LLP; Erik Johnson

(57) ABSTRACT

An integrated semiconductor device includes a substrate, a first vertical transistor, and a second vertical transistor. The substrate has a first substrate region and a second substrate region. The first vertical transistor is disposed on the substrate in the first substrate region. The first vertical transistor is n-type field-effect vertical transistor (n-VFET) with a first channel crystalline orientation. The second vertical transistor is disposed on the substrate in the second substrate region. The second vertical transistor is p-type field-effect vertical transistor (p-VFET) with a second channel crystalline orientation. The first channel crystalline orientation is different from the second channel orientation. A common bottom source and drain region as well as common bottom and top spacers regions are provided for the first vertical transistor and the second vertical transistor.

20 Claims, 9 Drawing Sheets

(51) Int. Cl.
*H01L 29/78* (2006.01)
*H01L 29/10* (2006.01)
*H01L 21/8238* (2006.01)
*H01L 21/033* (2006.01)
*H01L 29/08* (2006.01)
*H01L 29/66* (2006.01)
*H01L 21/8234* (2006.01)
*H01L 29/04* (2006.01)
*H01L 27/24* (2006.01)

(52) U.S. Cl.
CPC ........ *H01L 21/823864* (2013.01); *H01L 21/823885* (2013.01); *H01L 29/0847* (2013.01); *H01L 29/1079* (2013.01); *H01L 29/2003* (2013.01); *H01L 29/66666* (2013.01); *H01L 29/7827* (2013.01); *H01L 21/823487* (2013.01); *H01L 27/2454* (2013.01); *H01L 29/045* (2013.01); *H01L 29/6656* (2013.01)

(58) Field of Classification Search
CPC ..... H01L 21/823864; H01L 21/823807; H01L 29/2003; H01L 29/7827; H01L 29/1079; H01L 29/6656; H01L 27/2454
See application file for complete search history.

(56) References Cited

U.S. PATENT DOCUMENTS

| | | |
|---|---|---|
| 8,211,786 B2 | 7/2012 | Cheng |
| 9,355,887 B2 | 5/2016 | Chan et al. |
| 9,508,799 B2 | 11/2016 | Weng et al. |
| 9,673,045 B2 | 6/2017 | Dasgupta et al. |
| 2004/0266076 A1 | 12/2004 | Doris et al. |
| 2009/0072312 A1 | 3/2009 | Chang et al. |
| 2011/0068375 A1* | 3/2011 | Jakschik ............ H01L 21/84 257/255 |
| 2013/0153964 A1 | 6/2013 | Guo et al. |
| 2017/0047331 A1 | 2/2017 | Chen et al. |

OTHER PUBLICATIONS

Leland Chang et al., "CMOS Circuit Performance Enhancement by Surface Orientation Optimization", IBM T. J. Watson Research Center, 2004; 4 pages.

List of IBM Patents or Patent Applications Treated as Related; Date Filed: Nov. 22, 2019, 2 pages.

Zhenxing Bi et al., "Integrated Device With Vertical Field-Effect Transistors and Hybrid Channels," U.S. Appl. No. 16/192,896, filed Nov. 16, 2018.

* cited by examiner

INTEGRATED DEVICE WITH VERTICAL FIELD-EFFECT TRANSISTORS AND HYBRID CHANNELS

DOMESTIC PRIORITY

This application is a divisional of U.S. patent application Ser. No. 16/192,896, filed Nov. 16, 2018, the disclosure of which is incorporated by reference herein in its entirety.

BACKGROUND

The present invention generally relates to fabrication methods and resulting structures for semiconductor devices. More specifically, the present invention relates to an integrated semiconductor device with vertical field-effect transistors and hybrid channels.

Semiconductor structures or devices can be embodied as vertical field effect transistors (VFETs). Performance and behavior characteristics of VFETs are influenced by the material of the device active regions. For example, p-type and n-type VFETs (p-VFET and n-VFET, respectively) have performance characteristics that depend on a material of the channels. Choosing the appropriate channel material for the different transistor types (e.g. p-VFET and n-VFET) is important in optimizing devices' performance. For example, p-VFETs are known to have better hole mobility using a silicon channel with a (111) or (110) crystal surface orientation (Si (111) or Si (110), respectively) than a silicon channel with a (100) crystal surface orientation (Si (100)). On the other hand n-VFET are known to have better electron mobility using a Si (100) channel than a Si(111) or Si(110) channel. Accordingly, it would be advantageous to provide hybrid channel orientations, namely, Si (100) channel on n-VFET and Si (111) on p-VFET, in a single integrated semiconductor circuit.

SUMMARY

According to a non-limiting embodiment of the present invention, an integrated semiconductor device is provided that includes a substrate, a first vertical transistor, and a second vertical transistor. The substrate has a first substrate region and a second substrate region. The first vertical transistor is disposed on the substrate in the first substrate region. The first vertical transistor is n-type field-effect vertical transistor (n-VFET) with a first channel crystalline orientation. The second vertical transistor is disposed on the substrate in the second substrate region. The second vertical transistor is p-type field-effect vertical transistor (p-VFET) with a second channel crystalline orientation. The first channel crystalline orientation is different from the second channel orientation. A common bottom source and drain region is provided for the first vertical transistor and the second vertical transistor. A common bottom spacer region for the first vertical transistor and the second vertical transistor as well as a common top spacer region for the first vertical transistor and the second vertical transistor are also provided.

Embodiments of the present invention are further directed to a method for fabricating an integrated semiconductor device. A non-limiting example of the method includes providing a substrate including a first substrate region and a second substrate region. The method further includes forming a first vertical transistor on the substrate in the first substrate region. The first vertical transistor is n-type field-effect vertical transistor (n-VFET) with a first channel crystalline orientation. Even further, the method includes forming a second vertical transistor on the substrate in the second substrate region. The second vertical transistor is p-type field-effect vertical transistor (p-VFET) with a second channel crystalline orientation. The first channel crystalline orientation is being different from the second channel orientation. In addition, the method provides for forming a common bottom source and drain region for the first vertical transistor and the second vertical transistor. Even further, the method provides for forming a common bottom spacer region for the first vertical transistor and the second vertical transistor as well as forming a common top spacer region for the first vertical transistor and the second vertical transistor.

According to yet another non-limiting embodiment, a method of fabricating an integrated semiconductor device includes forming a first fin channel and a second fin channel on a substrate with a first substrate region and a second substrate region. The first fin channel is formed in the first substrate region and the second fin channel is formed in the second substrate. The first fin channel includes silicon (Si) with (100) crystal orientation (Si (100)) and the second fin channel includes silicon (Si) with (111) crystal orientation (Si (111)). The method further includes modifying the first fin channel into a n-type vertical field-effect transistor (n-VFET) and modifying the second fin channel into a p-type vertical field-effect transistor (p-VFET). In addition, the method provides for forming a common bottom source and drain region for the n-VFET and the p-VFET. Even further, the method provides for forming a common bottom spacer region for the n-VFET and the p-VFET as well as forming a common top spacer region for the n-VFET and the p-VFET.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 2:
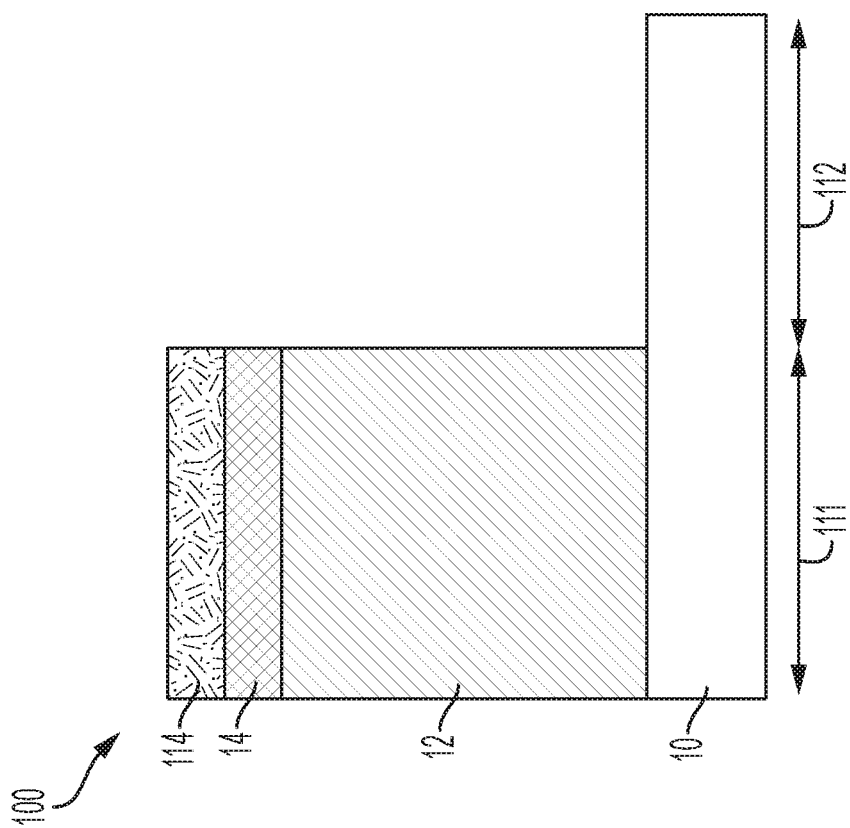
FIG. 2 depicts a cross-sectional view illustrating fin structures being grown, patterned and etched on a substrate in accordance with embodiments of this invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in present semiconductor technology, for example, complementary metal oxide semiconductor (CMOS) technology, devices such as p-type and n-type VFETs (p-VFET and n-VFET, respectively) are typically fabricated upon semiconductor substrates, such as silicon (Si) substrates, which have a single crystal orientation. In particular, most of today's semiconductor devices are built upon Si having a (100) crystal orientation (Si (100)).

Electrons are known to have a high mobility for a Si (100) surface orientation, but holes are known to have high mobility for a (111) surface orientation. In other words, hole mobility values on Si (100) are roughly 2×4× lower than the corresponding electron mobility for (111) crystallographic orientation. To compensate for this discrepancy, p-VFETs are typically designed with larger widths in order to balance pull-up currents against the n-VFET pull-down currents and achieve uniform circuit switching. P-VFETs having larger widths are undesirable because they take up a significant amount of chip area. On the other hand, hole mobilities on Si (111) are higher than on Si(100). Therefore, p-VFETs formed on a (111) surface will exhibit significantly higher drive currents than n-VFETs formed on a (100) surface. Electron mobilities on Si (111) surfaces, however, are significantly degraded compared to Si (100) surfaces. Accordingly, the Si (111) surface is optimal for p-VFET devices because of excellent hole mobility, but such a crystal orientation is not beneficial for n-VFET devices. Instead, the Si (100) surface is optimal for n-VFET devices because that crystal orientation favors electron mobility.

Conventional methods to form planar hybrid substrates with different surface orientations generally employ wafer bonding. More specifically, the planar hybrid substrate is obtained mainly through semiconductor-to-insulator, or insulator-to-insulator wafer bonding to achieve p-VFETS and n-VFETS on their own optimized crystal orientation for high performance device manufacture. The disadvantage of such method and configuration is that at least one type of MOSFET (either p-VFETS or n-VFETS) is on a semiconductor-on-insulator (SOI), while the other type of MOSFET is either on a bulk semiconductor or an SOI with a thicker SOI film. Another conventional method for providing CMOS integrated circuits (ICs) with bulk-like p-VFETS and n-VFETS is achieved by shallow trench isolation (STI). However, this method results in a device that consumes a large chip area requires deep STI depth. In view of the forgoing, there is a need for providing a structure having both p-VFETS and n-VFETS on a substrate with different crystal orientations.

Turning now to an overview of the aspects of the invention, one or more embodiments of the invention address the above-described shortcomings of the prior art by providing an integrated device with vertical field effect transistors and hybrid channels, namely, a (100) orientation n-VFET channel and a (111) orientation p-VFET channel fabricated by heteroepitaxial growth of a buffer layer (e.g. GaN layer) on silicon substrate with (100) orientation (Si (100)) with a bottom isolation layer (e.g. $Si_xN_y$ layer).

Figure 1:
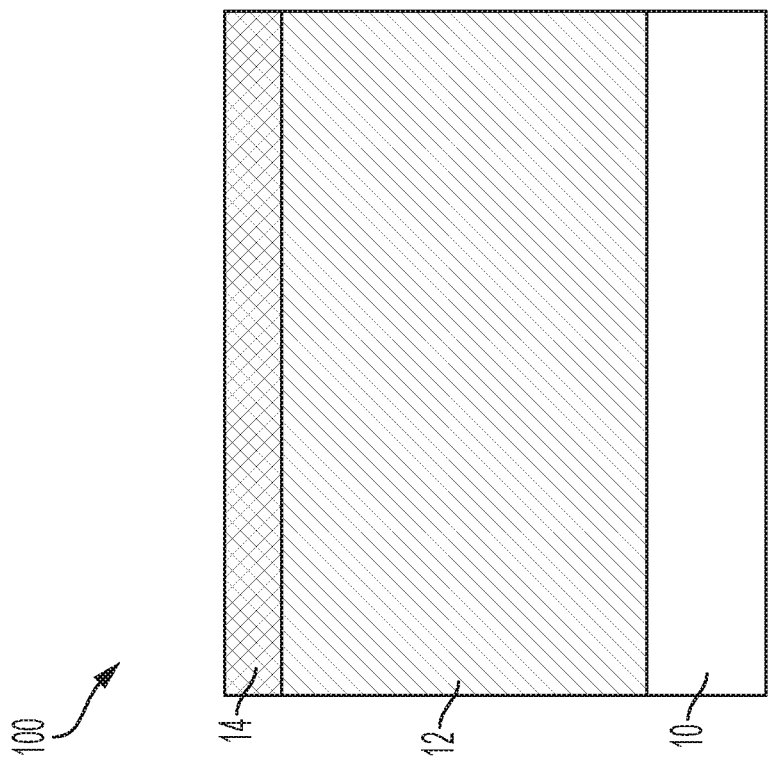
FIG. 1 depicts a cross-sectional view illustrating a starting structure for fabricating an integrated semiconductor device in accordance with embodiments of this invention.

Turning now to a more detailed description of aspects of the present invention, FIG. 1 depicts a cross-sectional view of an integrated device 100 after an initial set of fabrication operations according to embodiments of the invention. The integrated device 100 includes a semiconductor substrate 10, a semiconductor layer 12, and a hard mask layer 14, configured and arranged as shown. The semiconductor substrate 10 can be a bulk substrate of a semiconductor material including, but not limited to, silicon (Si), silicon germanium (SiGe), silicon carbide (SiC), silicon-germanium-carbon (SiGeC) or other like semiconductor material. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide.

In addition, multiple layers of the semiconductor materials can be used as the semiconductor material of the semiconductor substrate 10, for example, a semiconductor-on-insulator substrate (SeOI), a silicon-on-insulator substrate (SOI), a germanium-on-insulator substrate (GeOI) or a silicon-germanium-on-insulator substrate (SGOI). The semiconductor substrate 10 can also have other layers forming the substrate 10, including high-k oxides and/or nitrides. In embodiments of the invention, the semiconductor substrate 10 is a silicon with (100) orientation (Si (100)).

The starting structure shown in FIG. 1 further includes a semiconductor layer 12, which can be, for example, silicon with (100) orientation. The semiconductor layer 12 is epitaxially grown over the semiconductor substrate 10. A hard mask 14 is formed over the upper surface of the semiconductor layer 12. The hard mask 14 can be formed by any conventional methods, such as, for example, chemical vapor deposition (CVD), plasma-enhanced chemical vapor deposition (PECVD), chemical solution deposition, atomic layer deposition, or physical vapor deposition. Alternatively, the hard mask 14 can be formed utilizing a thermal oxidation, nitridation or oxynitridation process. The hard mask 14 is composed of a dielectric material such as, for example, an oxide, nitride, oxynitride or a multilayered stack thereof. In embodiments of the invention, the hard mask 14 includes silicon mononitride (SiN).

Figure 6:
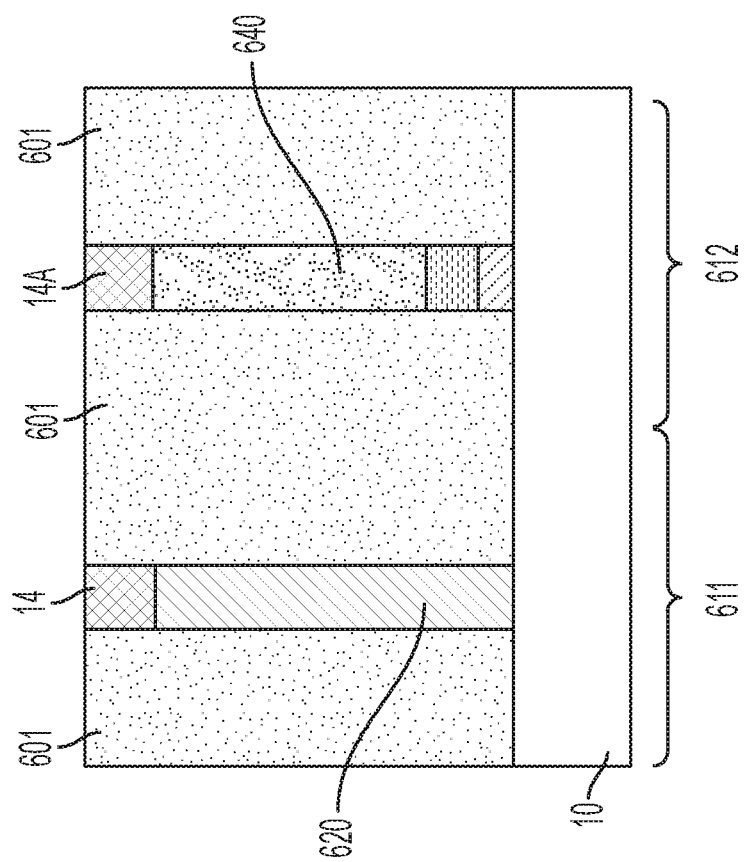
FIG. 6 depicts a cross-sectional view illustrating formation of a first channel and a second channel in accordance with embodiments of this invention.

In FIG. 2, the semiconductor layer 12 and the hard mask 14 are recessed in a second substrate region 112 by conventional patterning and etching processes to form a fin shape at a first substrate region 111 in an n-VFET region 611 (shown in FIG. 6). The first substrate region 111 can be used as a basis for the formation of a n-type transistor in the n-VFET region 611 (shown in FIG. 6).

Further, as shown in FIG. 2, in embodiments of the invention, a mask layer 114 can be patterned using lithographical techniques. The mask layer 114 is used to protect the first substrate region 111 from, for example, a reactive ion etch (RIE) or similar etching process that is employed to create the recess in the second region 112.

Figure 3:
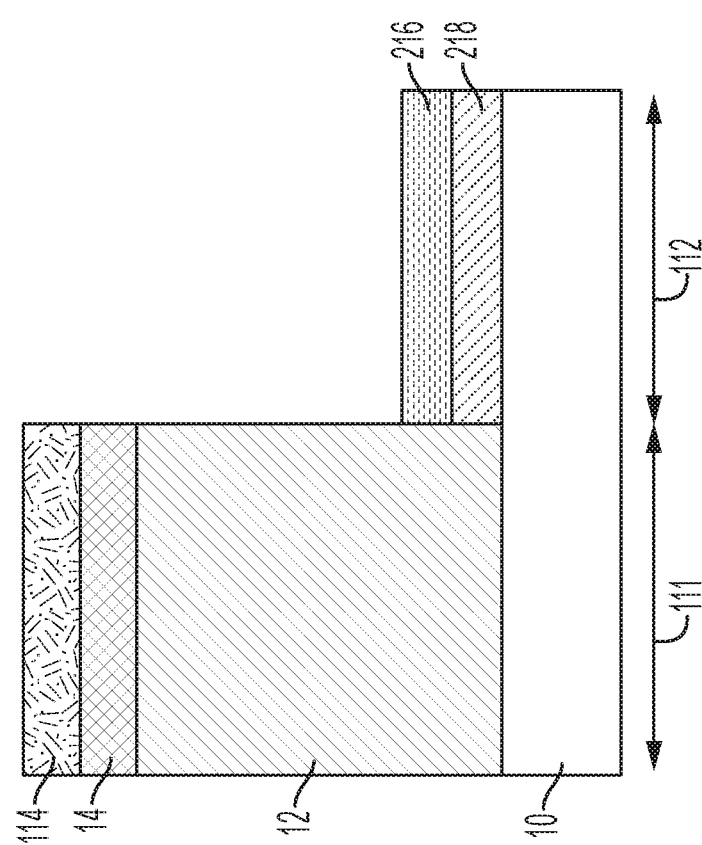
FIG. 3 depicts a cross-sectional view illustrating formation of a p-type transistor in a second substrate region in accordance with embodiments of this invention.

In FIG. 3, a second semiconductor layer 216 is formed over the semiconductor substrate 10 by epitaxial growth in the second substrate region 112. FIG. 3 illustrates the initial stage of structuring a p-type transistor in a p-VFET region 612 (shown in FIG. 6) by forming a fin shape at the second substrate region 112. In an embodiment of the invention, the second semiconductor layer 216 is composed of a III-V material.

The term III-V material, as used herein, refers to a material that includes at least one group III element and at least one group V element. By way of example only, suitable III-V materials include, but are not limited to, aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium antimonide, indium arsenide, indium arsenide antimonide phosphide, indium gallium arsenide, indium gallium nitride, indium gallium phosphide, indium nitride, indium phosphide and/or combinations including at least one of the foregoing materials.

According to embodiments of the invention, the III-V material is epitaxially grown in the second substrate region 112 on the semiconductor substrate 10 using a molecular-beam approach to form the second semiconductor layer 216. Molecular-beam epitaxy (MBE) is a process well known to those of skill in the art. In general, molecular beam epitaxy is conducted under a vacuum (e.g., in a vacuum chamber) where component elements contained in separate effusion cells are heated until the elements sublimate. The resulting gaseous elements then condense on the target substrate. In this case, the component elements are III-V materials.

In embodiments of the invention, the III-V material is gallium nitride (GaN). With this approach, a thin film layer 218 having general formula $Si_xN_y$ is formed under the second semiconductor layer 216 due to nucleation process during the epitaxial growth of the second semiconductor layer 216 on the semiconductor substrate 10. In other words, the film layer 218 separates the second semiconductor layer 216 (i.e., GaN layer) from the semiconductor substrate 10 (i.e., Si (100) layer).

The III-V material(s) deposited in the second substrate region 112 can be deposited as a single layer or as multiple layers, each layer containing a III-V material. Thus, the second semiconductor layer 216 can be made up of a single layer of a III-V material or alternatively, multiple layers (in a stacked configuration) each layer containing a III-V material.

Figure 4:
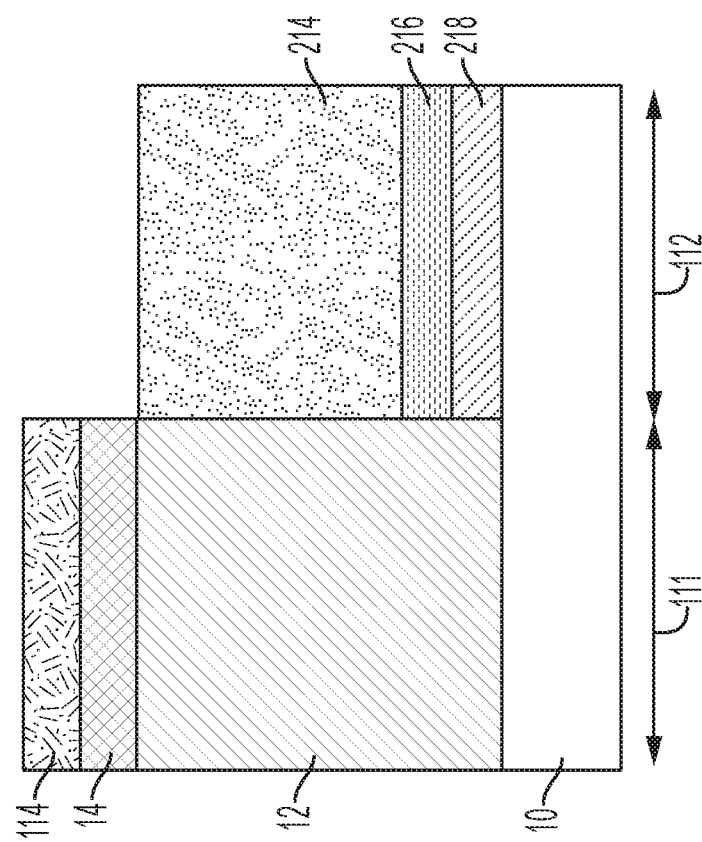
FIG. 4 depicts a cross-sectional view illustrating formation of semiconductor layers in the second substrate region in accordance with embodiments of this invention.

In FIG. 4, a third semiconductor layer 214 is formed over the second semiconductor layer 216 in the second substrate region 112. The third semiconductor layer 214 is formed by epitaxial growth, and composed of silicon with orientation (111) (Si (111)). In other words, according to embodiments of the invention, as further described below, the n-VFET region 611 (shown in FIG. 6) is formed in the first substrate region 111, including the first semiconductor layer 12 composed of Si (100), and the p-VFET region 612 (shown in FIG. 6) is formed in the second substrate region 112, including the second semiconductor layer 216 and the third semiconductor layer 214 composed of Si (111).

Figure 5:
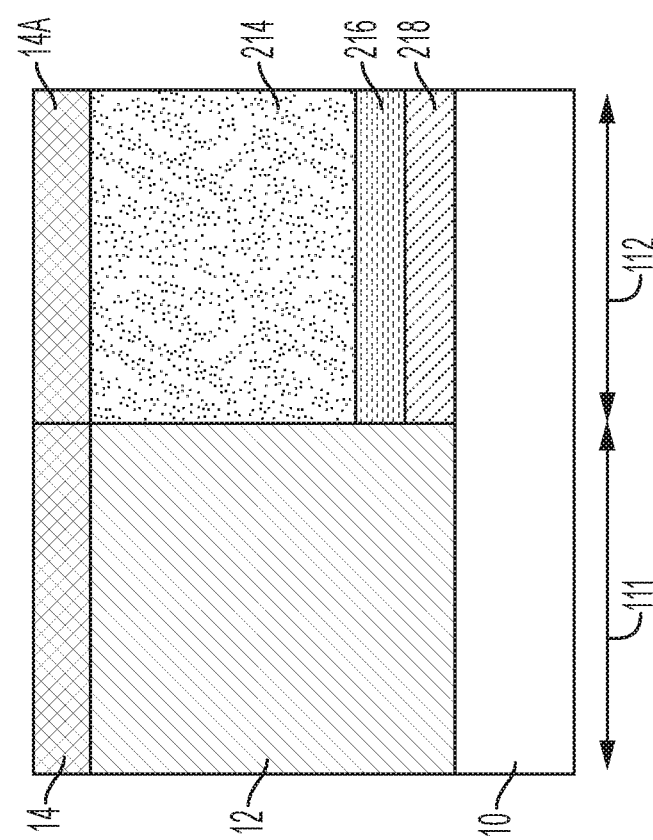
FIG. 5 depicts a cross-sectional view illustrating formation of a hard mask over upper surfaces of the semiconductor layers in accordance with embodiments of this invention.

In FIG. 5, a hard mask 14A is formed by any conventional method (for example, methods described above) over the upper surface of the semiconductor layer 114 in the second substrate region 112. The hard mask 14A is flush with the hard mask 14. In embodiments of the invention, the hard mask 14A includes SiN.

In FIG. 6, a first channel 620 is formed over the first substrate region 111 (i.e. the n-VFET region 611), and a second channel 640 is formed from over the second substrate region (i.e. the p-VFET region 612). According to the embodiments of the invention, the layers 12, 214, 216 and 218 have been etched using a selective, directional etch (e.g., RIE) to form the first channel 620 and the second channel 640 in the n-VFET region 611 and the p-VFET region 612, respectively. Further, the first channel 620 and second channel 640 can be formed by a sidewall image transfer (SIT) process, self-aligned double patterning (SADP) process, or self-aligned quadruple patterning (SAQP) process, to provide a tight pitch between the first channel 620 and the second channel 640. According to embodiments of the invention (as shown in FIG. 6), the uppermost surface of the hard mask 14A is coplanar with the uppermost surface of the hard mask 14. In other words, the first channel 620 and second channel 640 are of equal height.

As further shown in FIG. 6, interlayer dielectric (ILD) material 601 is deposited in empty regions that surround the first channel 620 and the second channel 640. The ILD material 601 is substantially coplanar with the upper surfaces of the hard masks 14 and 14A following a chemical mechanical polishing (CMP) process.

Figure 7:
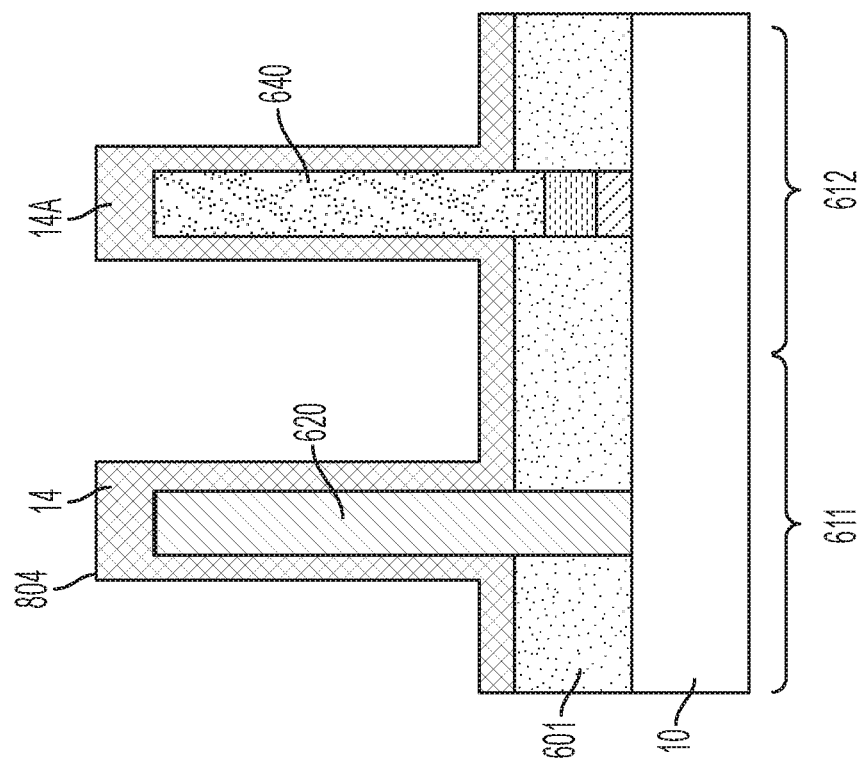

In FIG. 7, a first top spacer 804 is formed over the first channel 620 and a second top spacer 806 is formed over the second channel 640.

Figure 8:
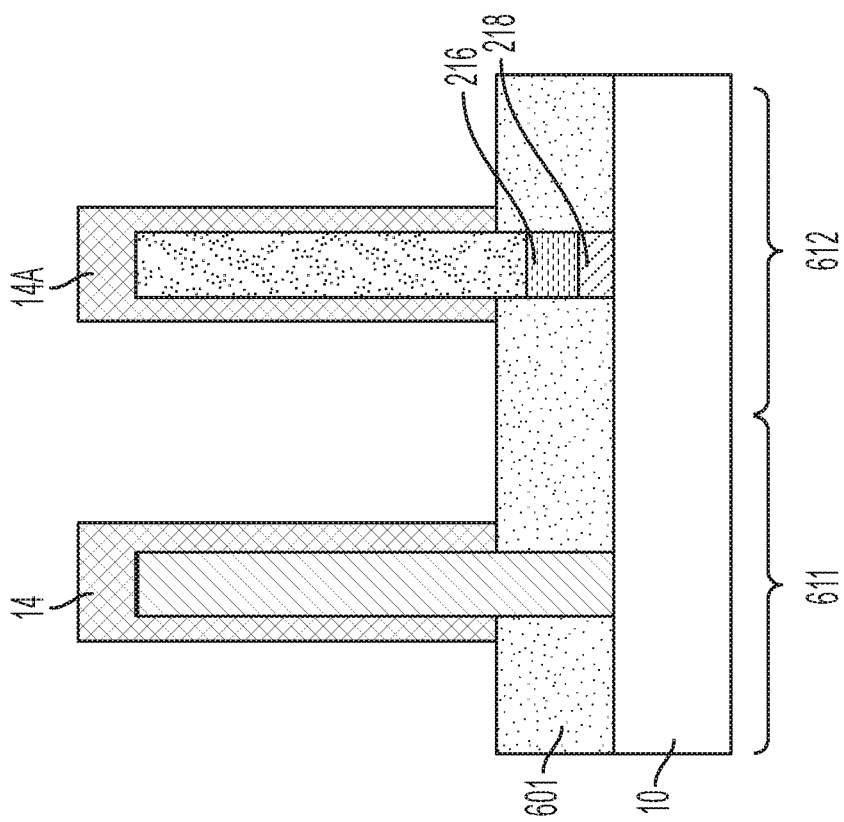
FIGS. 7 and 8 illustrate formation of top spacers over the first and second channels and deposition of interlayer dielectric (ILD) material in accordance with embodiments of this invention.

As shown in FIG. 8, the first top spacer 804 and the second top spacer 806 can be formed by direct deposition and RIE or another suitable processes, and can include SiN or other nitride. Prior to the direct deposition described above, the ILD material 601 has been recessed.

Figure 9:
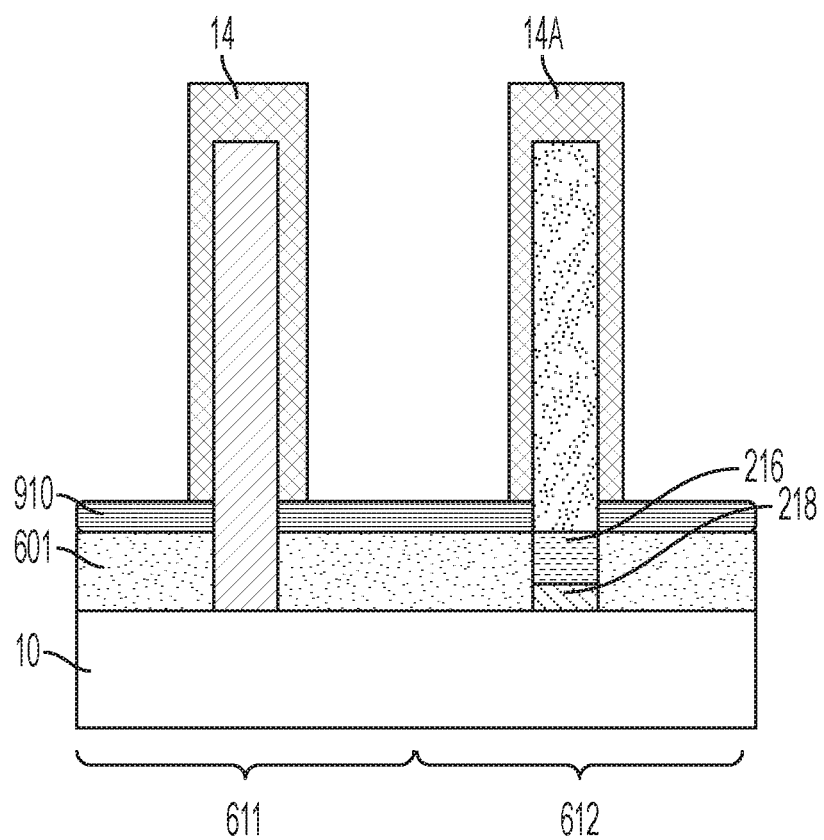
FIG. 9 depicts a cross-sectional view illustrating formation of a bottom source drain layer in accordance with embodiments of this invention.

FIG. 9 illustrates a bottom source/drain layer 910 being formed over the ILD material 601. The bottom source/drain layer 910 will serve as the basis for forming the bottom source/drain region of the applicable VFET. According to embodiments of the invention, doping of the bottom source/drain layer 910 can be performed in-situ or ex-situ. By in-situ it is meant that dopants are introduced during epitaxial growth of layer 910. In-situ doping involves introducing the dopants (e.g., via ion implantation) following epitaxial growth of the layer 910. The composition of layer 910 and the dopants vary depending on the type of VFET being formed. By way of example only, for a p-channel a suitable composition for layer 910 is boron (B) doped SiGe, whereas for an n-channel a suitable composition for layer 910 is phosphorous (P) doped silicon carbide (SiC). The bottom source/drain layer 910 can be formed by epitaxial growth, as well as an epitaxial pre-cleaning process, which is performed prior to growing the bottom source/drain layer 910, which involves etching the uppermost surface of the ILD material 601.

Figure 10:
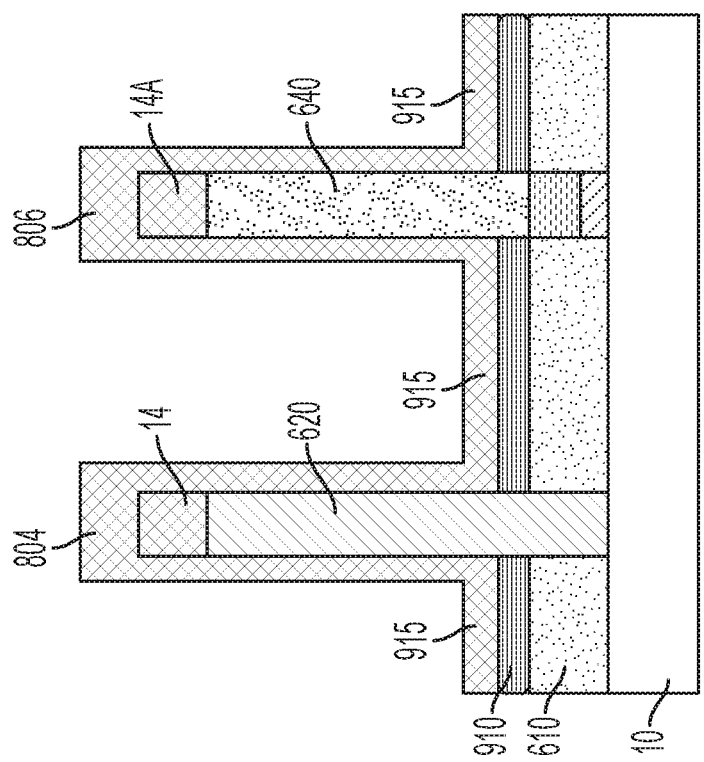
FIG. 10 depicts a cross-sectional view illustrating formation of bottom spacers in accordance with embodiments of this invention.

As illustrated in FIG. 10, bottom spacers 915 are formed on the bottom source/drain layer 910 on opposite sides of the first channel 620 and the second channel 640. The bottom spacers 915 can be formed by depositing a suitable spacer material over the bottom source/drain layer 910, and then patterning the spacer material into the individual bottom spacers 915. Suitable spacer materials include, but are not limited to, oxides such as silicon oxide ($SiO_2$), nitrides such as silicon nitride (SiN), and/or low-K materials such as carbon-doped oxide materials containing silicon (Si), carbon (C), oxygen (O), and hydrogen (H) (SiCOH) or siliconborocarbonitride (SiBCN). The term "low-κ" as used herein refers to a material having a relative dielectric constant κ which is lower than that of silicon nitride.

Figure 11:
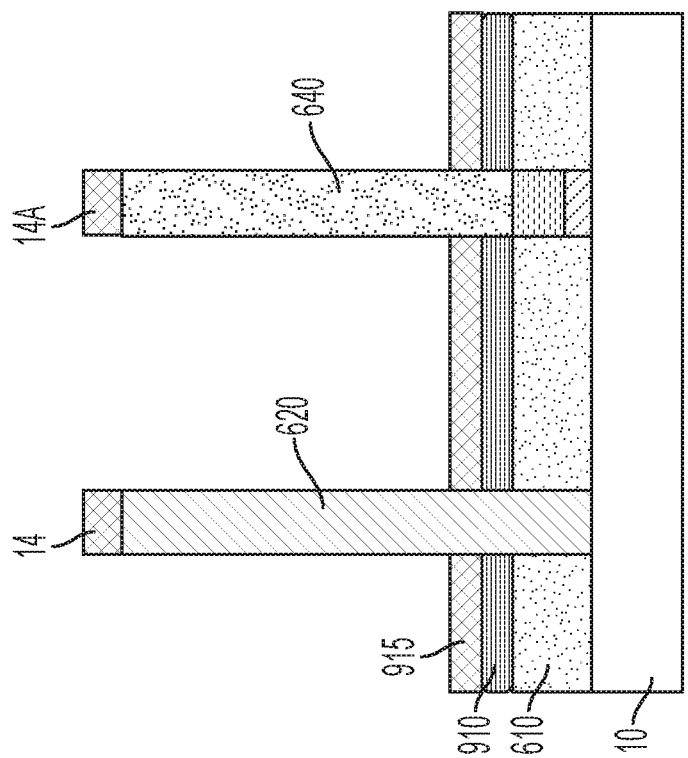
FIG. 11 depict a cross-sectional view illustrating formation of bottom spacers in accordance with embodiments of this invention.

During this step, as shown in FIG. 11, the first top spacer 804 and the second top spacer 806 can also be removed from the sidewalls of the first channel 620 and the second channel 640 by conventional methods, such as isotropic plasma etching.

Figure 12:
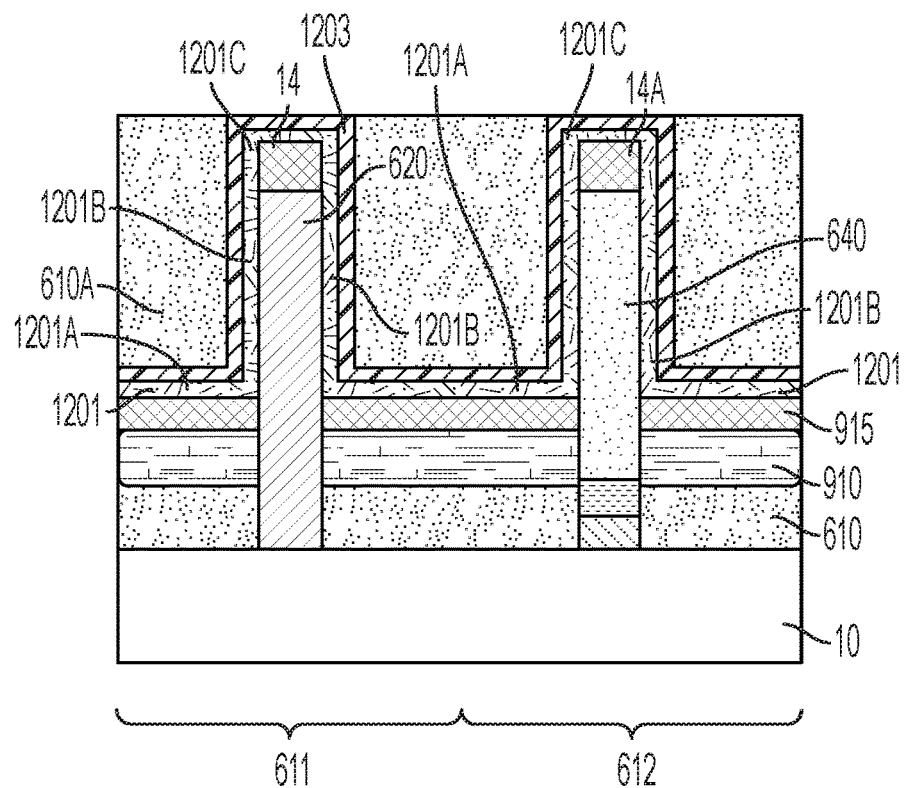
FIG. 12 depicts a cross-sectional view illustrating formation of a gate dielectric layer and deposition of ILD material in accordance with embodiments of this invention.
Figure 13:
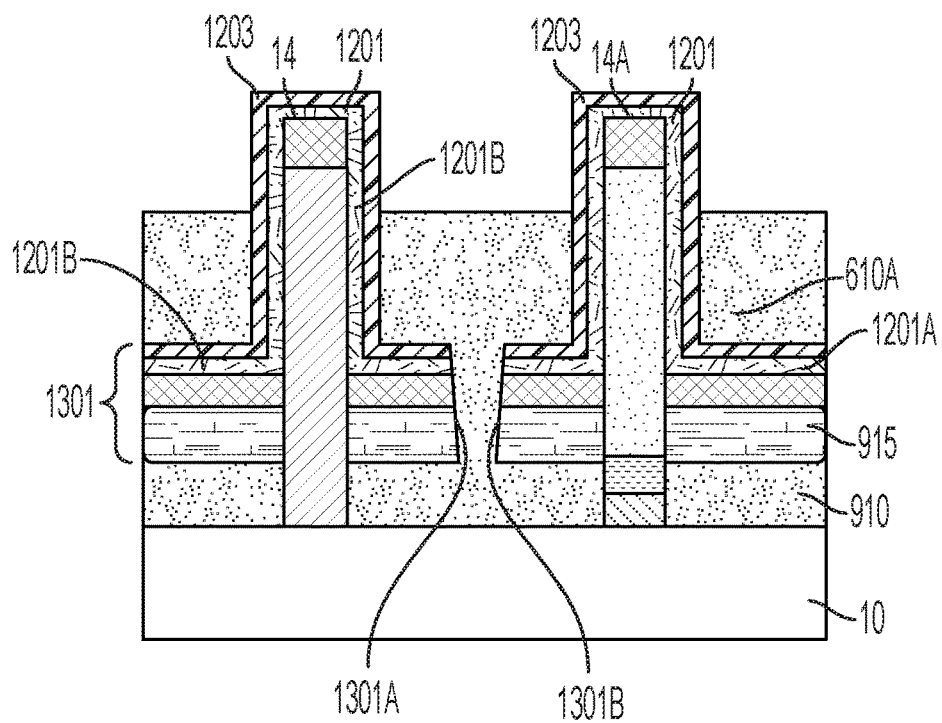
FIG. 13 depicts a cross-sectional view illustrating formation of a gate layer and recession of ILD material in accordance with embodiments of this invention.

In FIG. 12, a gate dielectric (e.g., high-k dielectric) layer 1201 is conformally deposited over upper surfaces of the bottom spacers 915, sidewalls of the first channel 620 and the second channel 640, and corresponding sidewalls and upper surfaces of the hard masks 14 and 14A. Thus, the high-k dielectric layer 1201 includes a lower portions 1201A running along the bottom spacers 915, a sidewall portions 1201B running along the respective sidewalls of the first channel 620 and the second channel 640, and the hard masks 14 and 14A, and an upper portions 1201C running along the upper surfaces of the hard masks 14 and 14A. A conformal setting metal layer 1203 is deposited onto the gate dielectric layer 1201 (e.g., high-k dielectric), for example, by CVD or ALD. The particular work function metal used can vary depending on whether an n-type or p-type transistor is desired. For instance, suitable n-type work function metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type work function metals include, but are not limited to, TiN, TaN, and tungsten (W). Suitable low resistance gate metals include, but are not limited to tungsten (W) and/or aluminum (Al). As shown in FIG. 13, the metal layer 1203 seals the gate dielectric layer 1201.

As further shown in FIG. 12, an interlayer dielectric (ILD) material 610A is deposited in empty regions along the gate dielectric (e.g., high-k dielectric) layer 1201 and conformal setting metal layer 1203. The ILD material 610A is substantially coplanar with the conformal setting metal layer 1203 that covers the upper portions 1201C following a chemical mechanical polishing (CMP) process.

In FIG. 13, a shallow trench isolation (STI) patterning is conducted to separate the continuous gate layer 1301 and the gate dielectric layer 1201 to form a gate layer 1301A and a gate layer 1301B, corresponding to the first channel 620 and the second channel 640, respectively. The ILD material 610A is recessed and polished back to expose the upper portions 1201C of the gate dielectric (e.g., high-k dielectric) layer 1201 surrounded by the top spacer material 1203.

Figure 14:
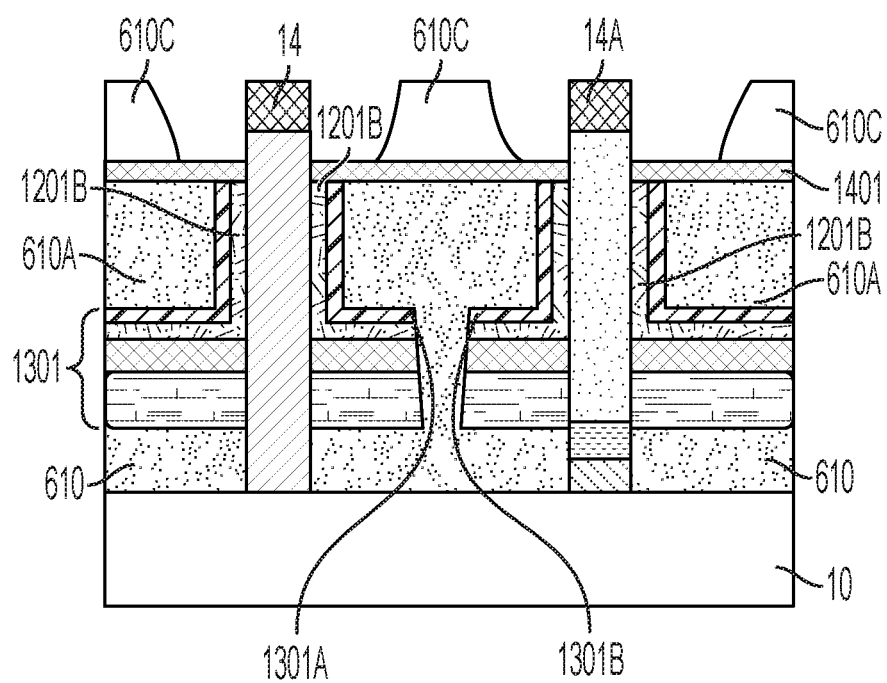
FIG. 14 depicts a cross-sectional view illustrating deposition of a top spacer metal in accordance with embodiments of this invention.

In FIG. 14, a top spacer metal 1401 is directionally deposited over the uppermost portion of the ILD material 610A. Suitable spacer materials include, but are not limited to, oxides such as $SiO_2$, nitrides such as SiN, and/or low-κ materials such as SiCOH or SiBCN. As shown in FIG. 14, the top spacer material 1401 seals the gate dielectric (e.g., high-k dielectric) layers 1201A and 1201B.

The structure is then surrounded with a filler dielectric 610C. The filler dielectric 610C is coplanar with the upper portions 1201C. The filler dielectric 610C is then polished back (i.e., recessed) to expose the top spacer material 1401 around the first channel 620 and the second channel 640, as shown in FIG. 14. Suitable dielectrics include, but are not limited to, $SiO_2$ and low-κ inter-layer dielectrics, such as SiCOH or SiBCN. Polishing back filler dielectric 610C can be achieved using a process such as chemical mechanical polishing or CMP.

Figure 15:
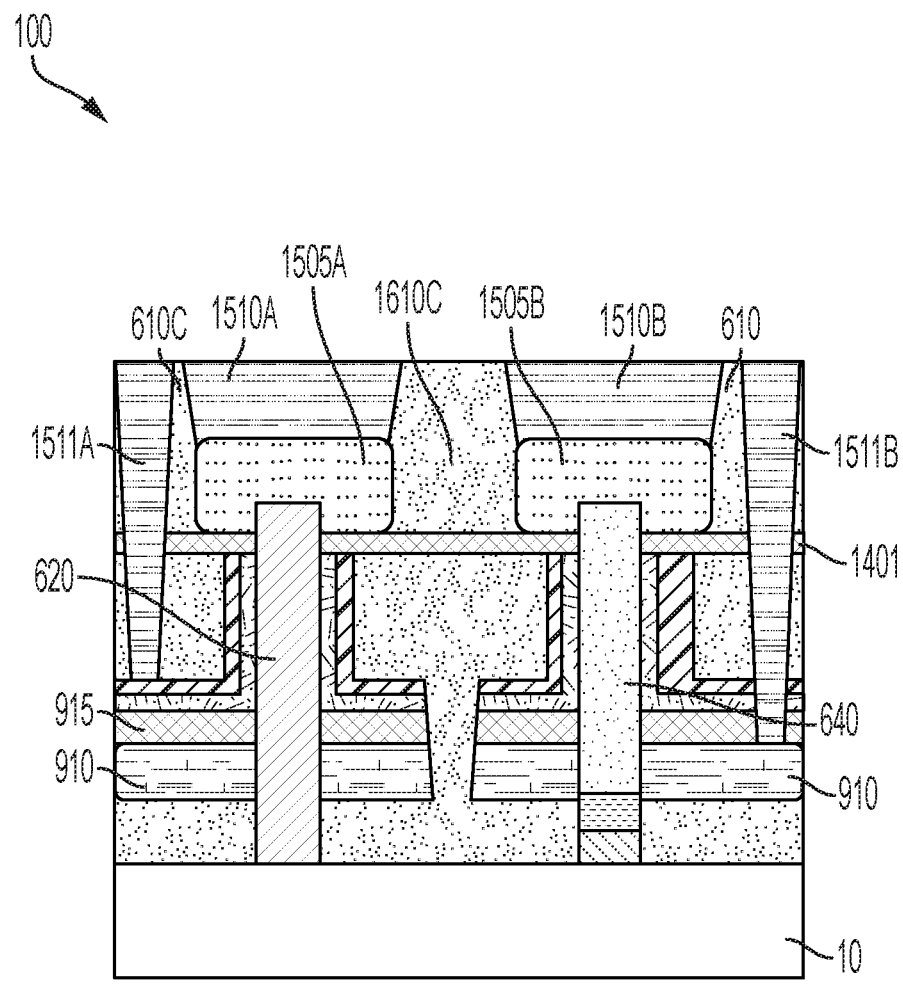
FIG. 15 depicts a cross-sectional view illustrating the integrated semiconductor device with vertical field-effect transistors in accordance with embodiments of this invention.

In FIG. 15, the hard masks 14 and 14A have been removed by conventional methods. Top source/drain regions 1505A and 1505B are then formed by coplanar epitaxy over the first channel 620 and the second channel 640, respectively. Similar to the doping of the bottom source/drain layer 910, the doping of the top source/drain regions 1505A and 1505B can be performed in-situ or ex-situ, and the composition of the top source/drain regions 1505A and 1505B and the dopants can vary depending on the type of VFET being formed.

As also shown in FIG. 15, a plurality of epitaxial contacts 1510A, 1510B, 1511A and 1511B are grown substantially simultaneously by n-type in-situ doped epitaxial growth processes (e.g., in-situ phosphorus doped silicon epitaxy). The epitaxial contacts 1510A and 1510B are disposed over the first channel 620 and the second channel 640, respectively. In accordance with embodiments of the invention, first one of the epitaxial contacts (namely, 1510A) is provided as n-VFET top source and drain contact, while second one of the epitaxial contacts (namely, 1510B) is provided as p-VFET top source and drain contact.

With reference to FIG. 15, formation of the integrated device according to the invention is completed.

It is to be understood that the process illustrated in FIGS. 1-15 can be revised such that the third semiconductor layer 214 (composed of Si (111)) is formed directly over the semiconductor substrate 10 in the second substrate region 112 by any conventional methods.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated semiconductor device comprising:
    a substrate comprising a first substrate region and a second substrate region;
    a first vertical transistor disposed on the substrate in the first substrate region, wherein the first vertical transistor is n-type field-effect vertical transistor (n-VFET) with a first channel crystalline orientation;
    a second vertical transistor disposed on the substrate in the second substrate region, wherein the second vertical transistor is p-type field-effect vertical transistor (p-VFET) with a second channel crystalline orientation, wherein the first channel crystalline orientation is different from the second channel orientation;
    a common bottom source and drain region for the first vertical transistor and the second vertical transistor;
    a common bottom spacer region for the first vertical transistor and the second vertical transistor; and
    a common top spacer region for the first vertical transistor and the second vertical transistor.

2. The integrated semiconductor device according to claim 1, wherein the first channel crystalline orientation is (100) and the second channel crystalline orientation is (111).

3. The integrated semiconductor device according to claim 1, wherein a fin of the first vertical transistor comprises silicon (Si) with (100) crystal orientation (Si (100)) and a fin of the second vertical transistor comprises silicon (Si) with (111) crystal orientation (Si (111)).

4. The integrated semiconductor device according to claim 1, wherein a fin of the second vertical transistor comprises a III-V material, selected from the group consisting of aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium antimonide, indium arsenide, indium arsenide antimonide phosphide, indium gallium arsenide, indium gallium nitride, indium gallium phosphide, indium nitride, indium phosphide and/or combinations thereof.

5. The integrated semiconductor device according to claim 4, wherein the III-V material is gallium nitride (GaN).

6. The integrated semiconductor device according to claim 5, wherein the fin of the second vertical transistor further comprises a film layer composed of a compound of formula $Si_xN_y$.

7. The integrated semiconductor device according to claim 1, wherein uppermost portions of a fin of the first vertical transistor and a fin of the second vertical transistor are coplanar.

8. The integrated semiconductor device according to claim 1 further comprising an interlayer dielectric (ILD) disposed around and over the first vertical transistor and the second vertical transistor.

9. An integrated semiconductor device comprising:
- a first fin channel on a substrate, the first fin channel comprising silicon having a (100) crystal orientation;
- a second fin channel over the substrate, the second fin channel comprising silicon having a (111) crystal orientation;
- a buffer layer positioned between the second fin channel and the substrate;
- an isolation layer positioned between the buffer layer and the substrate;
- wherein a topmost surface of the first fin channel is coplanar to a topmost surface of the second fin channel.

10. The integrated semiconductor device according to claim 9, wherein the buffer layer comprises a III-V semiconductor material.

11. The integrated semiconductor device according to claim 10, wherein the buffer layer comprises gallium nitride (GaN).

12. The integrated semiconductor device according to claim 9, wherein the isolation layer comprises a compound having a formula $Si_xN_y$.

13. The integrated semiconductor device according to claim 9 further comprising a common top spacer between the first fin channel and the second fin channel.

14. The integrated semiconductor device according to claim 13 further comprising a first top source or drain region on the topmost surface of the first fin channel and a second top source or drain region on the topmost surface of the second fin channel.

15. The integrated semiconductor device according to claim 14, wherein the first top source or drain region is positioned on a surface of the common top spacer and the second top source or drain region is positioned on the surface of the common top spacer.

16. The integrated semiconductor device according to claim 15, wherein a bottommost surface of the first top source or drain region is coplanar to a bottommost surface of the second top source or drain region.

17. The integrated semiconductor device according to claim 9 further comprising a common bottom source or drain region formed over the substrate.

18. The integrated semiconductor device according to claim 17 further comprising a common bottom spacer positioned on the common bottom source or drain region.

19. The integrated semiconductor device according to claim 18, wherein a first sidewall of the common bottom spacer is in direct contact with a sidewall of the first fin channel and a second sidewall of the common bottom spacer is in direct contact with a sidewall of the second fin channel.

20. The integrated semiconductor device according to claim 9, wherein a bottommost surface of the first fin channel is coplanar to a bottommost surface of the isolation layer.

* * * * *